(12) United States Patent
Ishitani (10) Patent No.: US 9,907,219 B2
(45) Date of Patent: Feb. 27, 2018

(54) TRAY FEEDER AND COMPONENT MOUNTING APPARATUS

(71) Applicant: Panasonic Intellectual Property Management Co., Ltd., Osaka (JP)

(72) Inventor: Yasuyuki Ishitani, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/863,847

(22) Filed: Sep. 24, 2015

(65) Prior Publication Data

US 2016/0143196 A1 May 19, 2016

(30) Foreign Application Priority Data

Nov. 14, 2014 (JP) ................................ 2014-231837

(51) Int. Cl.
*B65G 1/00* (2006.01)
*H05K 13/02* (2006.01)
*H05K 13/04* (2006.01)

(52) U.S. Cl.
CPC ....... *H05K 13/021* (2013.01); *H05K 13/0434* (2013.01)

(58) Field of Classification Search
CPC .................................................. B65G 65/00
USPC ....... 414/807, 268, 277, 282, 331.01, 331.11
See application file for complete search history.

(56) References Cited

U.S. PATENT DOCUMENTS

| 2005/0057847 | A1* | 3/2005 | Armagost | G11B 15/6835 360/92.1 |
| 2012/0308359 | A1 | 12/2012 | Morishima | |
| 2013/0302116 | A1* | 11/2013 | Hill | G11B 15/6835 414/275 |
| 2013/0317643 | A1* | 11/2013 | Ostwald | G11B 15/6825 700/218 |

FOREIGN PATENT DOCUMENTS

| JP | 11-163592 A | 6/1999 |
| JP | 2012-114324 A | 6/2012 |

* cited by examiner

*Primary Examiner* — Saul Rodriguez
*Assistant Examiner* — Willie Berry, Jr.
(74) *Attorney, Agent, or Firm* — Pearne & Gordon LLP (57) ABSTRACT

A tray feeder extracts one of trays where components are stored from corresponding one of magazines, and moves the extracted tray to a component feed position. The tray feeder includes a rack portion having a plurality of magazine holding portions disposed in a vertical direction, and a tray movement portion that extracts one of the trays from corresponding one of the magazines through a corresponding one of tray extraction ports. The magazine holding portions hold the magazines respectively which are inserted horizontally through magazine exits/entrances. Each of the magazine holding portions includes a block unit which blocks communication between the magazine exit/entrance and the tray extraction port of corresponding magazine holding portion when the magazine is removed from the corresponding magazine holding portion through the magazine exit/entrance.

5 Claims, 12 Drawing Sheets

TRAY FEEDER AND COMPONENT MOUNTING APPARATUS

CROSS REFERENCE TO RELATED APPLICATION

This application is based on Japanese Patent Application (No. 2014-231837) filed on Nov. 14, 2014, the contents of which are incorporated herein by reference.

BACKGROUND

1. Technical Field

The invention relates to a tray feeder which extracts one of trays having components stored therein from one of magazines, and moves the extracted tray to a component feed position, and a component mounting apparatus which is provided with the tray feeder.

2. Description of the Related Art

A tray feeder which extracts a tray having components stored therein from a magazine, and positions the extracted tray in a component feed position has been heretofore known as one kind of component feeding device provided in a component mounting apparatus. The tray feeder is provided with a reception portion which receives a magazine containing trays, and a tray movement portion which extracts one of the trays from the magazine through a tray extraction port provided in the reception portion and moves the extracted tray to the component feed position. The component mounting apparatus uses a mounting head to pick up ones of components fed by the tray feeder and mount the picked components on a substrate.

In such a tray feeder, when components are picked up sequentially from a tray and the tray is short of the components, a worker has to replace the tray manually (for example, JP-A-2012-114324). When the size of each component is large and the number of components which can be stored in the tray is small, the frequency of tray replacement work becomes high. In addition thereto, it is necessary to replace the tray at a timing when the tray becomes empty. Therefore, the worker has to constantly stay by the side of the tray feeder. In order to solve such a problem and improve workability, configuration may be made such that a magazine containing a plurality of trays short of components can be removed/inserted from/into the reception portion so that the plurality of trays can be replaced in a batch. However, since a cavity which is formed after the magazine has been removed from the reception portion is connected to the tray movement portion through the tray extraction port, there is a fear that the worker may touch by mistake the tray movement portion which is in operation.

A tray feeder disclosed in JP-A-11-163592 has been known as a tray feeder in which a plurality of trays can be replaced in a batch and which is free from the aforementioned disadvantage. The tray feeder includes a feed stage and two standby stages provided on opposite side portions of the feed stage so that a plurality of magazines can be moved between the feed stage and each standby stage. While a tray (for feeding components) is extracted from one magazine positioned in the feed stage, a worker can insert/remove any other magazine positioned in each standby stage to thereby replace the trays in a batch. In the tray feeder, a tray movement portion is provided on the side of the feed stage. Accordingly, the worker can be prevented from touching the tray movement portion in operation even when the worker puts his/her hand into a cavity which is formed after the other magazine positioned in the standby stage has been removed. Thus, working safety is high.

However, in the tray feeder disclosed in JP-A-11-163592, the plurality of stages (the feed stage and the two standby stages) are disposed laterally in order to make it easy to move the magazines which are heavy. For this reason, there is a problem that the tray feeder is increased in size.

SUMMARY

To solve the foregoing problem, an object of the invention is to provide a tray feeder and a component mounting apparatus which can secure working safety without increasing the size.

The tray feeder according to the invention is a tray feeder which extracts one of trays where components are stored from one of magazines, and moves the extracted tray to a component feed position, the tray feeder including: a rack portion which includes a plurality of magazine holding portions disposed in a vertical direction, the magazine holding portions configured to hold the magazines respectively which are inserted horizontally through magazine exits/entrances provided correspondingly to the magazine holding portions; and a tray movement portion which extracts one of the trays from corresponding one of the magazines held in the magazine holding portions, through one of tray extraction ports provided correspondingly to the magazine holding portions respectively, and moves the extracted tray to the component feed position; wherein each of the magazine holding portions includes a block unit which blocks communication between the magazine exit/entrance and the tray extraction port provided correspondingly to one of the magazine holding portions when the magazine is removed from the corresponding one of the magazine holding portions through the magazine exit/entrance.

The component mounting apparatus according to the invention includes: the tray feeder according to the invention; and a mounting head, wherein the tray feeder moves one of the trays to the component feed position to thereby feed the components to the mounting head, and the mounting head picks up ones of the components and mounts the picked components on a substrate.

According to the invention, it is possible to secure working safety without increasing the size of the tray feeder.

DETAILED DESCRIPTION OF THE EXEMPLARY EMBODIMENTS

Figure 1:
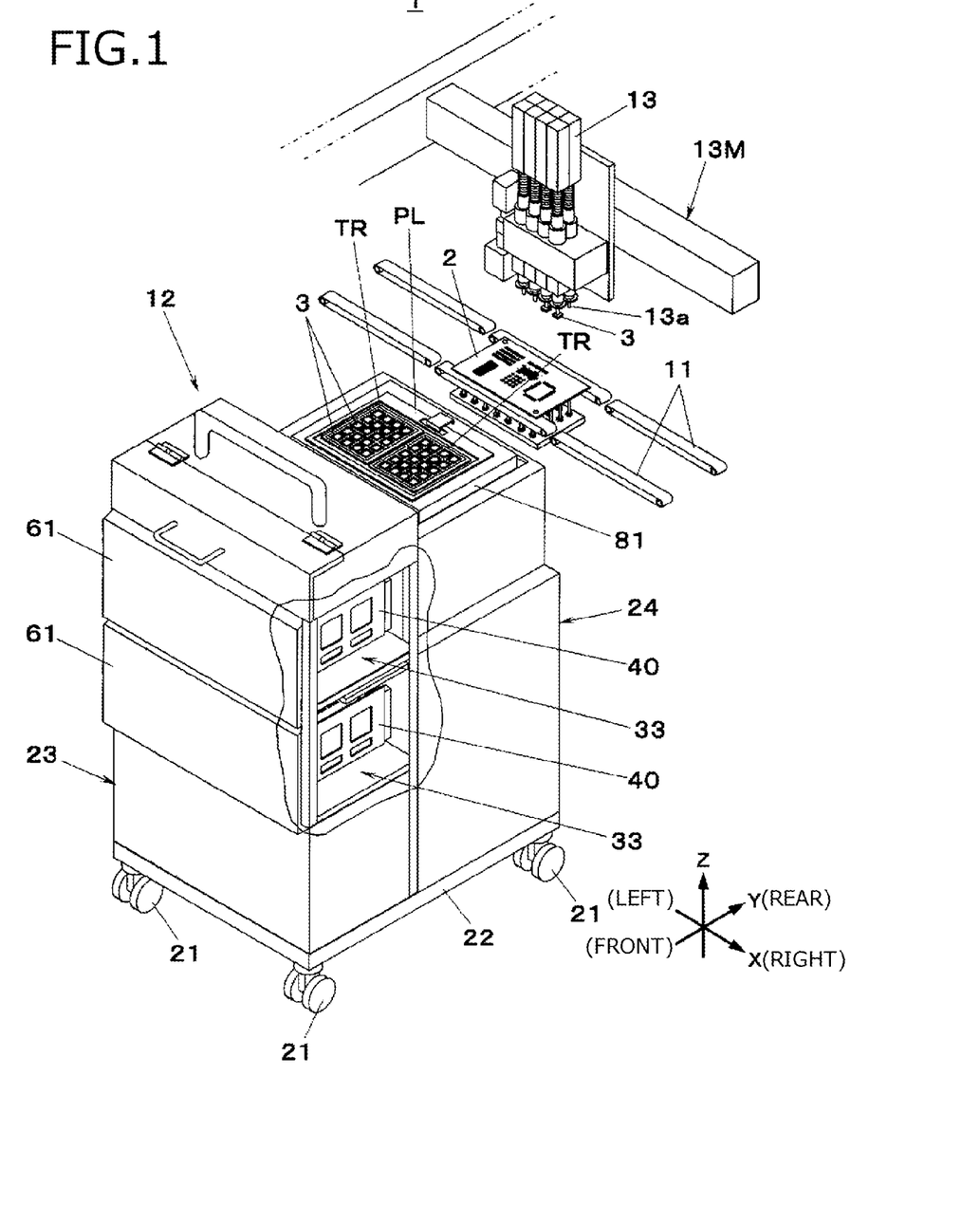
FIG. 1 is a main part perspective view of a component mounting apparatus in an embodiment of the invention.

An embodiment of the invention will be described below with reference to the drawings. FIG. 1 shows a component mounting apparatus 1 in an embodiment of the invention. The component mounting apparatus 1 is an apparatus which mounts components 3 on a substrate 2. The component mounting apparatus 1 together with other not-shown apparatuses such as a screen printing machine, an inspection machine and a reflow furnace constitutes a component mounting line. In the embodiment, for convenience of explanation, a left/right direction seen from a not-shown worker will be designated as X-axis direction, a front/rear direction seen from the worker will be designated as Y-axis direction, and an up/down direction (a vertical direction) seen from the worker will be designated as Z-axis direction.

In FIG. 1, the component mounting apparatus 1 includes a transfer conveyor 11, a tray feeder 12, and a mounting head 13. The transfer conveyor 11 is provided on a not-shown pedestal. The tray feeder 12 serves as a component feeding device. The tray feeder 12 and the mounting head 13 are arranged adjacently to the transfer conveyor 11.

The transfer conveyor 11 conveys a substrate 2 in the X-axis direction and positions the substrate 2 at a predetermined work position. The tray feeder 12 moves flat plate-like trays TR, each having a plurality of components 3 stored therein, to a predetermined component feed position shown in FIG. 1 to thereby feed the components 3. The mounting head 13 includes a plurality of suction nozzles 13a extending downwards. The mounting head 13 is moved by a head movement mechanism 13M so that ones of the components 3 fed by the tray feeder 12 are picked up and mounted on the substrate 2 by the suction nozzles 13a. In the embodiment, the trays TR are placed on a dish-like pallet PL. The tray feeder 12 moves the pallet PL to the component feed position to thereby feed the components 3. One or a plurality of trays TR may be placed on one pallet PL in accordance with the size or shape of each tray TR. A case in which two trays TR are placed on one pallet PL is shown in the embodiment.

Figure 2:
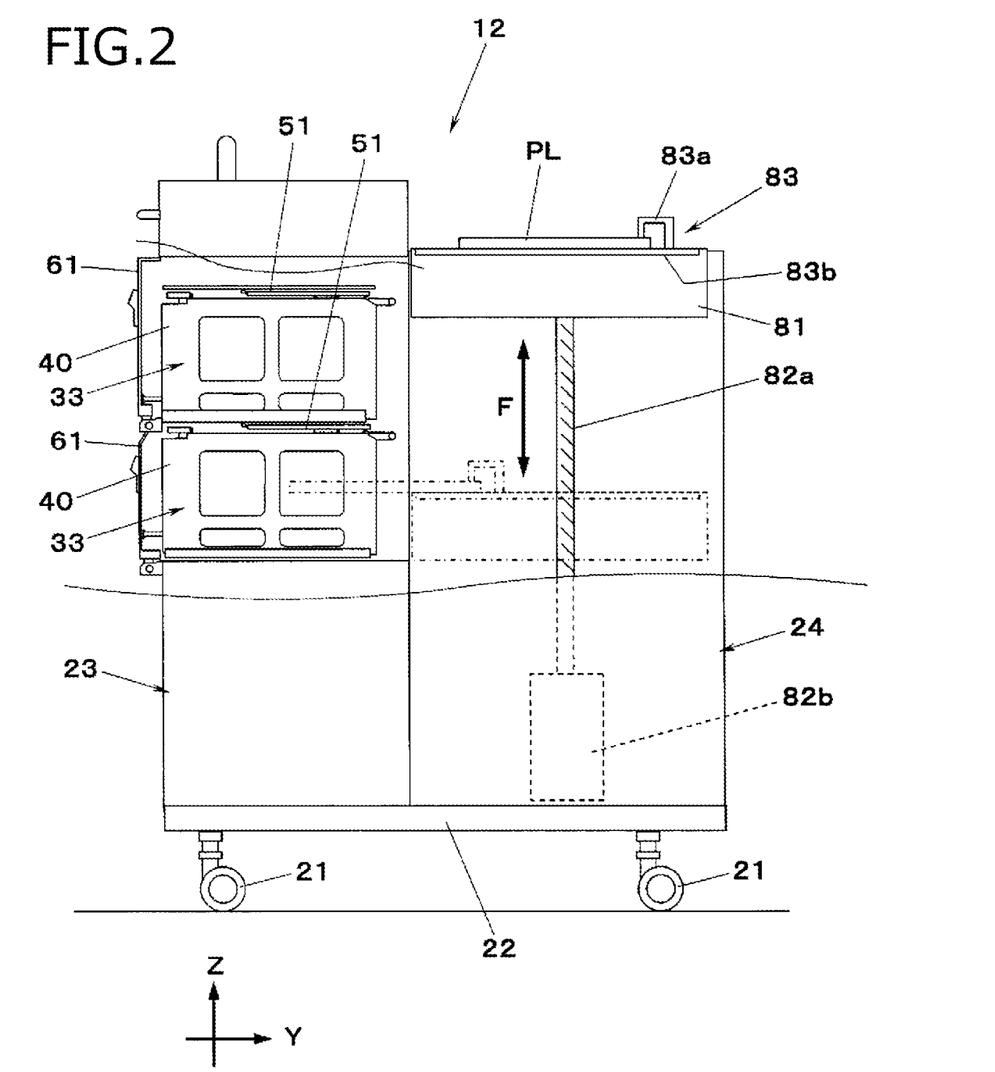
FIG. 2 is a sectional side view of a part of a tray feeder provided in the component mounting apparatus in the embodiment of the invention.

In the component mounting apparatus 1 in the embodiment, configuration of the tray feeder 12 has characteristics and will be described below in detail. In FIG. 1 and FIG. 2, the tray feeder 12 includes a rack portion 23 and a tray movement portion 24 which are provided on a cart portion 22. The cart portion 22 can move on the floor through a plurality of casters 21.

Figure 3:
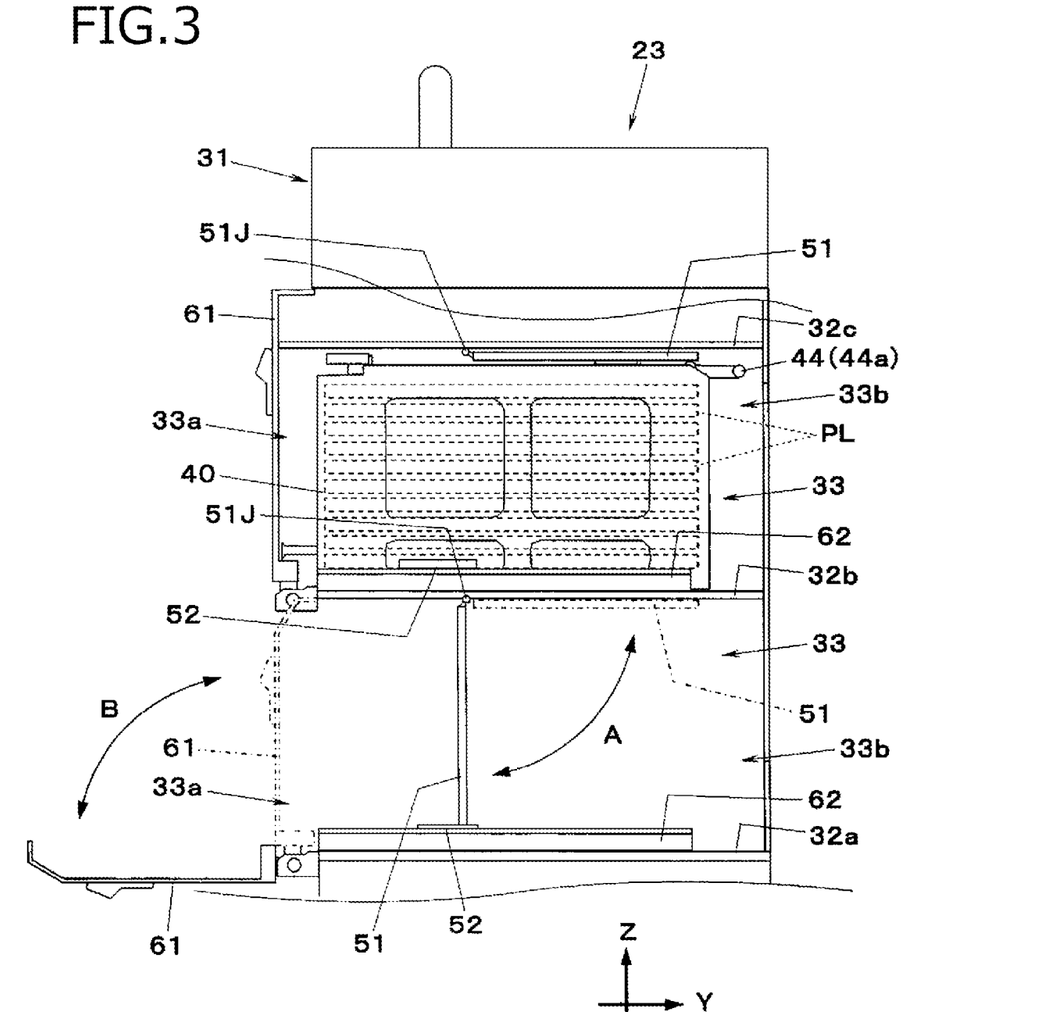
FIG. 3 is a partial sectional side view of the tray feeder in the embodiment of the invention.
Figure 4:
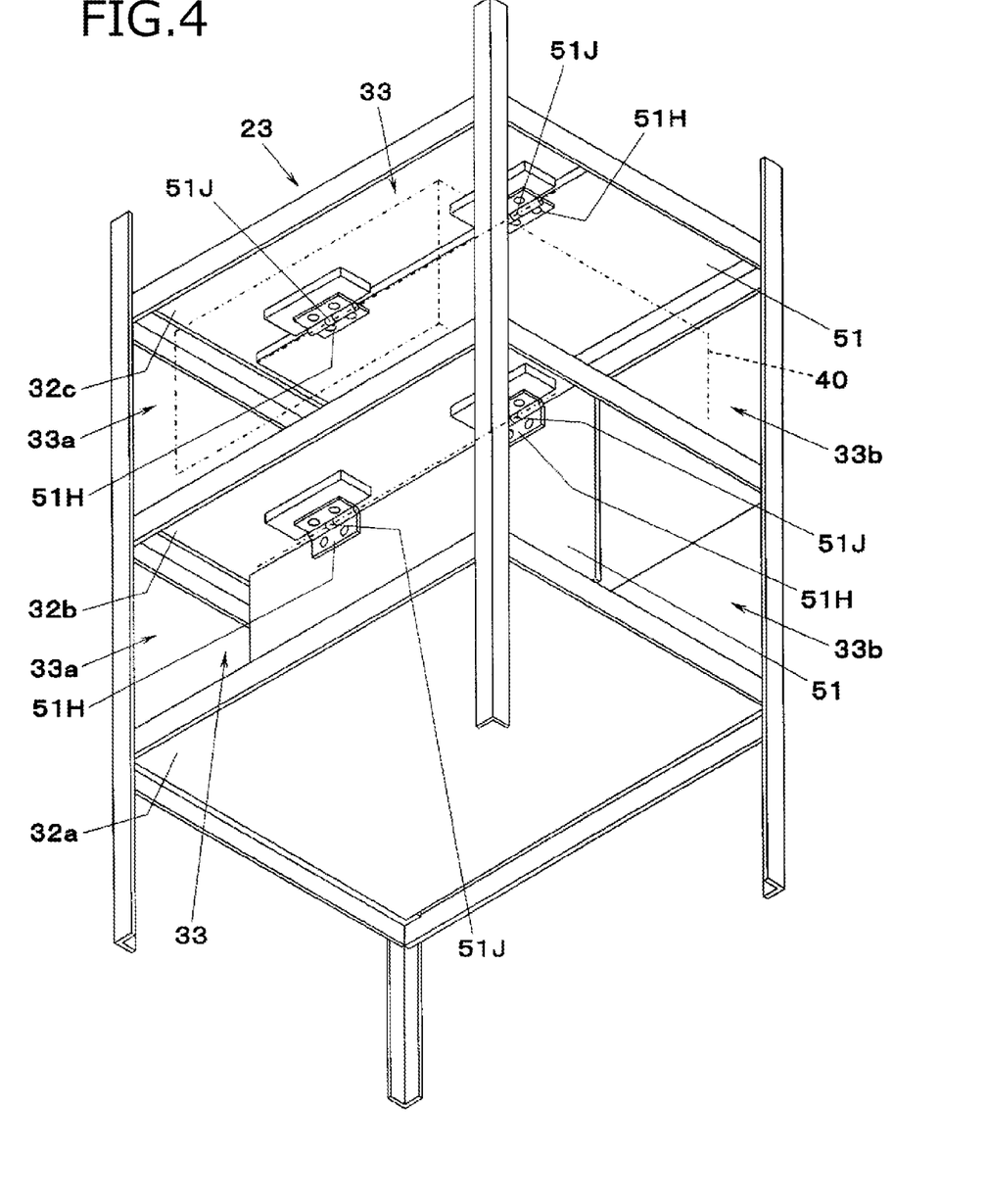
FIG. 4 is a partial bottom perspective view of the tray feeder in the embodiment of the invention.

In FIG. 3 and FIG. 4, the rack portion 23 has a first partition wall 32a, a second partition wall 32b and a third partition wall 32c, which are provided in the named order from a lower side inside a housing 31. Each of the first partition wall 32a, the second partition wall 32b and the third partition wall 32c is arranged horizontally. A region between the first partition wall 32a and the second partition wall 32b and a region between the second partition wall 32b and the third partition wall 32c serve as magazine holding portions 33 respectively (also see FIG. 1 and FIG. 2). That is, the rack portion 23 is configured that a plurality of (two in this case) magazine holding portions 33 are disposed in the up/down direction. A front-side opening of each magazine holding portion 33 serves as a magazine exit/entrance 33a while a rear-side opening of the magazine holding portion 33 serves as a tray extraction port 33b. In the rack portion 23, magazines 40 which are horizontally inserted from the magazine exits/entrances 33a provided correspondingly to the magazine holding portions 33 are received and held in the magazine holding portions 33 respectively.

Figure 5A:
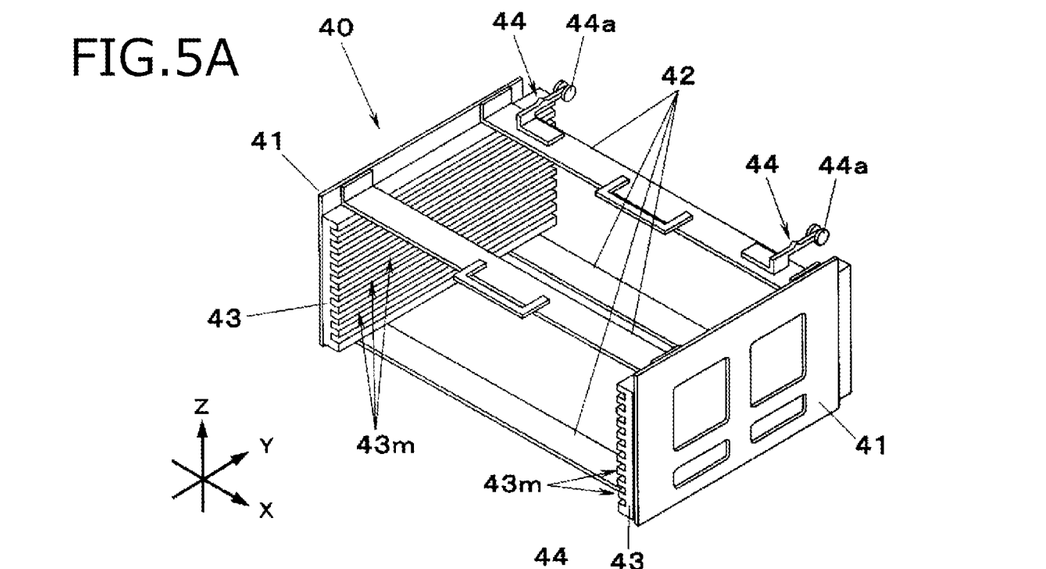
FIGS. 5A and 5B are perspective views of a magazine provided in the tray feeder in the embodiment of the invention.
Figure 5B:
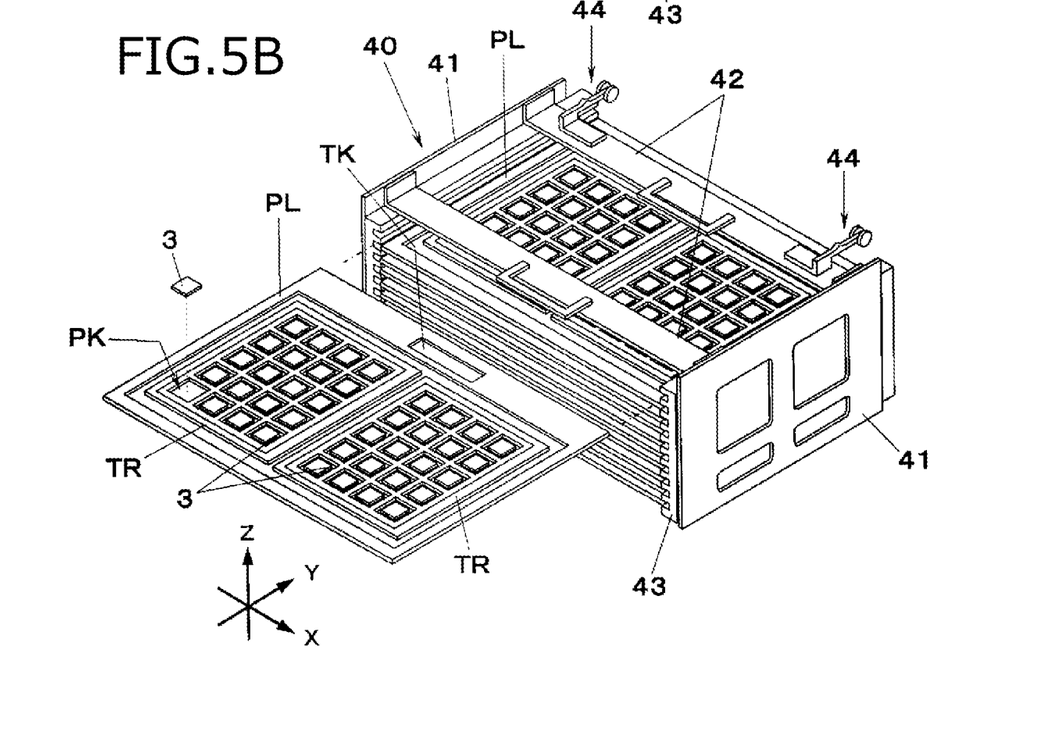
Figure 6:
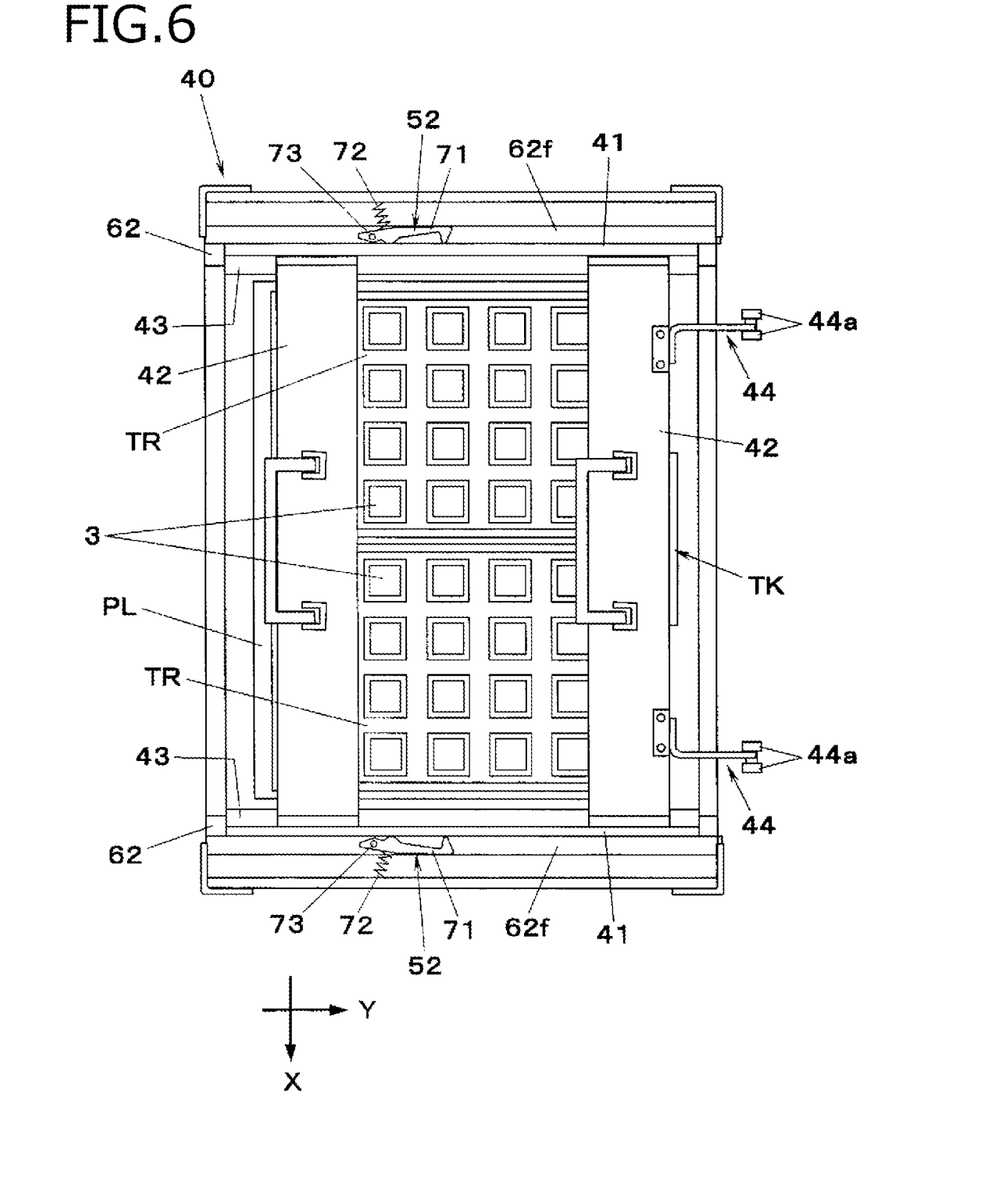
FIG. 6 is a plan view showing the magazine provided together with trays in the tray feeder in the embodiment of the invention.

In FIGS. 5A and 5B and FIG. 6, each magazine 40 has a pair of wall portions 41 and upper and lower connection portions 42. The pair of wall portions 41 are disposed in the X-axis direction. The upper and lower connection portions 42 connect the pair of wall portions 41 to each other. A pair of pallet holding plates 43 are provided on opposed surfaces of the pair of wall portions 41. In each tray TR, a large number of component storage portions PK each of which is opened in its upper side are formed into a matrix pattern, and components 3 are placed on the component storage portions PK to be stored therein. Each of the pallets PL on which the trays TR are placed is inserted horizontally so that opposite ends of the pallet PL can be supported by groove portions 43m formed in the pair of pallet retention plates 43 belonging to the magazine 40. Thus, the pallets PL can be held in the magazine 40.

A pair of left and right pressing parts 44 are attached to (a rear-side connection portion 42 of) an upper portion of each magazine 40. Each pressing part 44 extends horizontally rearwards and has a roller 44a at its rear end. The roller 44a is positioned more rearward than a rear end of the wall portion 41 of the magazine 40.

In FIG. 3, each magazine holding portion 33 includes a shutter member 51 and a lock mechanism 52. In FIG. 4, the shutter member 51 of each magazine holding portion 33 is made of a plate-type member. The shutter member 51 is attached to a ceiling surface of the magazine holding portion 33 (to each of the second partition wall 32b in the magazine holding portion 33 on a lower stage side and the third partition wall 32c in the magazine holding portion 33 on an upper stage side) by hinge members 51H having swing shafts 51J each extending in the X-axis direction (that is, the horizontal direction perpendicular to an insertion direction of the magazine 40 into the magazine holding portion 33). Each shutter member 51 can swing between a vertical posture and a substantially horizontal posture (arrow A indicated in FIG. 3). In the vertical posture, the shutter member 51 blocks communication between the magazine exit/entrance 33a and the tray extraction port 33b. In the substantially horizontal posture, the shutter member 51 allows communication between the magazine exit/entrance 33a and the tray extraction port 33b.

Thus, each shutter member 51 has a configuration in which the shutter member 51 is supported to be able to swing around the swing shafts 51J each extending in the horizontal direction (X-axis direction) perpendicular to the insertion direction of the magazine 40 into the magazine holding portion 33 so that the shutter member 51 swings between a "block position" for blocking communication between the magazine exit/entrance 33a and the tray extraction port 33b and a "non-block position" for allowing communication between the magazine exit/entrance 33a and the tray extraction port 33b.

In FIG. 1, FIG. 2 and FIG. 3, doors 61 are provided in the front surface of the housing 31 correspondingly to the magazine exits/entrances 33a of the magazine holding portions 33 respectively. Each of the doors 61 is opened and closed in the up/down direction (arrow B indicated in FIG. 3). When the door 61 is opened, the magazine exit/entrance 33a corresponding to the door 61 is opened. When the door 61 is closed, the magazine exit/entrance 33a corresponding to the door 61 is closed. FIG. 3 shows a state in which the door 61 on the lower stage side is opened while the door 61 on the upper stage side is closed.

In FIG. 3 and FIG. 6, a pair of guides 62 which extend in the front/rear direction (Y-axis direction) while facing each other in the X-axis direction are provided on the floor of each magazine holding portion 33 (on each of the first partition wall 32a in the magazine holding portion 33 on the lower stage side and the second partition wall 32b in the magazine holding portion 33 on the upper stage side). The pair of guides 62 serve as movement rails for the magazine 40 when the magazine 40 is put into or taken out of the magazine holding portion 33. The pair of guides 62 serve as support members for the magazine 40 in a state in which the magazine 40 is received in the magazine holding portion 33.

Figure 7A:
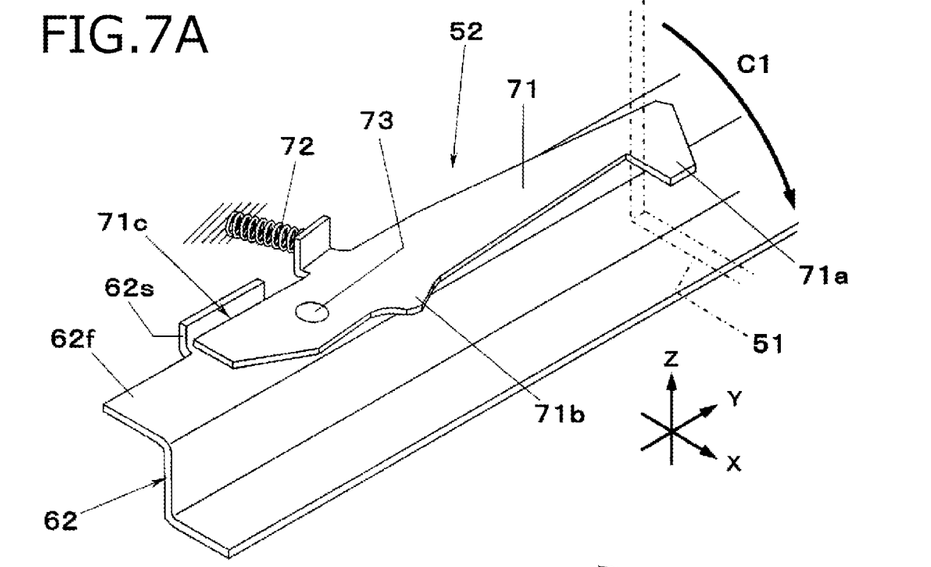
FIGS. 7A and 7B are partial perspective views of the tray feeder in the embodiment of the invention.
Figure 7B:
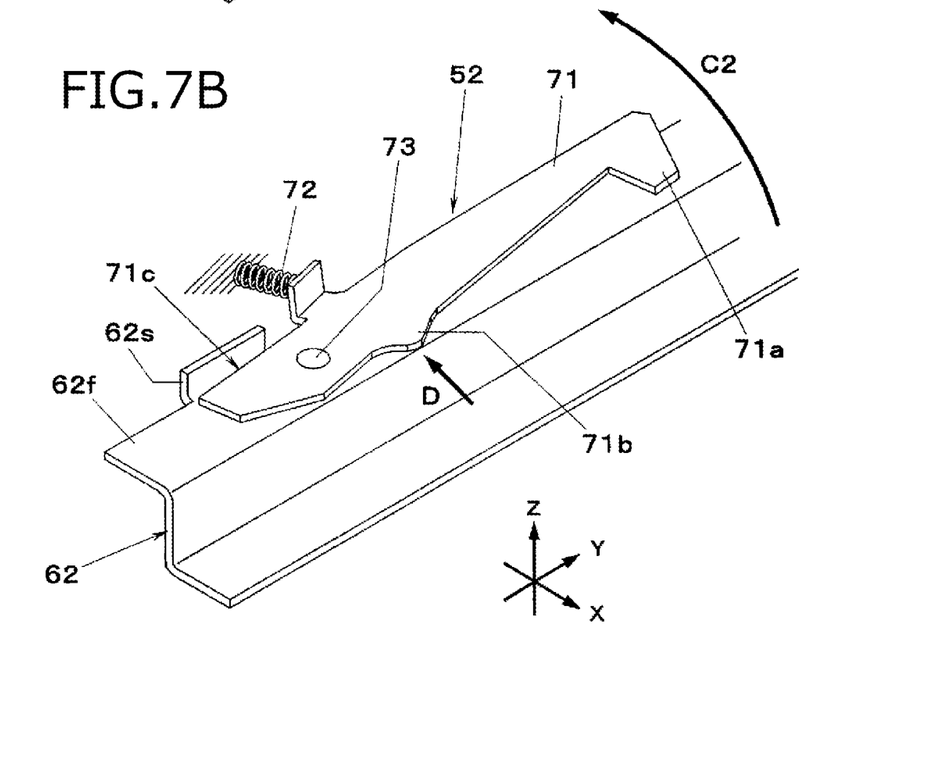

In FIG. 6 and FIGS. 7A and 7B, the lock mechanism 52 of each magazine holding portion 33 includes lock members 71 and urging springs 72. The lock members 71 are attached to horizontal flange portions 62f of the guides 62 respectively. The urging springs 72 urge the lock members 71 respectively. The lock members 71 are provided on the flange portions 62f of the guides 62 by use of pin members 73 so as to be rotatable within a horizontal plane.

In FIGS. 7A and 7B, each of the lock members 71 has a lock portion 71a which is provided at its rear-side end portion to protrude inwards (in a direction in which the pair of guides 62 face each other). The lock member 71 also has a protruding portion 71b which is provided at a portion between the pin member 73 and the lock portion 71a to protrude inwards. The urging spring 72 urges the lock member 71 in a direction in which the lock portion 71a goes into a space between the pair of guides 62 (this space is a space into which the magazine 40 is inserted and which will be hereinafter referred to as magazine insertion space) (arrow C1 indicated in FIG. 7A).

In FIG. 7A, the lock member 71 is positioned in a "lock position" in which an abutment portion 71c has been brought into abutment against a stopper 62s in the state in which the protruding portion 71b is not pressed. The stopper 62s is provided on the flange portion 62f of the guide 62. In the lock position, both the protruding portion 71b and the lock portion 71a of the lock member 71 protrude into the magazine insertion space. When the protruding portion 71b is pressed outwards (in a direction in which the pair of guides 62 go counter to each other) in the state in which the lock member 71 is in the lock position (arrow D indicated in FIG. 7B), the lock member 71 rotates around the pin member 73 against urging force of the urging spring 72 (arrow C2 indicated in FIG. 7B). When the protruding portion 71b is pushed to reach a place where the protruding portion 71b falls within an upper surface region of the flange portion 62f, the lock member 71 is positioned in a "non-lock position" in which the lock portion 71 a retreats from the magazine insertion space to fall within the upper surface region of the flange portion 62f (FIG. 7B).

In the state in which the magazine 40 is not inserted into the magazine holding portion 33, the shutter member 51 hangs down vertically due to its own weight to be positioned in the block position (see the shutter member 51 of the magazine holding portion 33 on the lower stage side as shown in FIG. 3 and FIG. 4). In addition, when the pair of lock members 71 are positioned in the lock position in the state in which the shutter member 51 is positioned in the block position, the lock portions 71a of the pair of lock members 71 are locked to a lower end of the shutter member 51 (see the shutter member 51 designated by a one-dot chain line in FIG. 7A). Thus, the shutter member 51 is locked in the block position.

Figure 8:
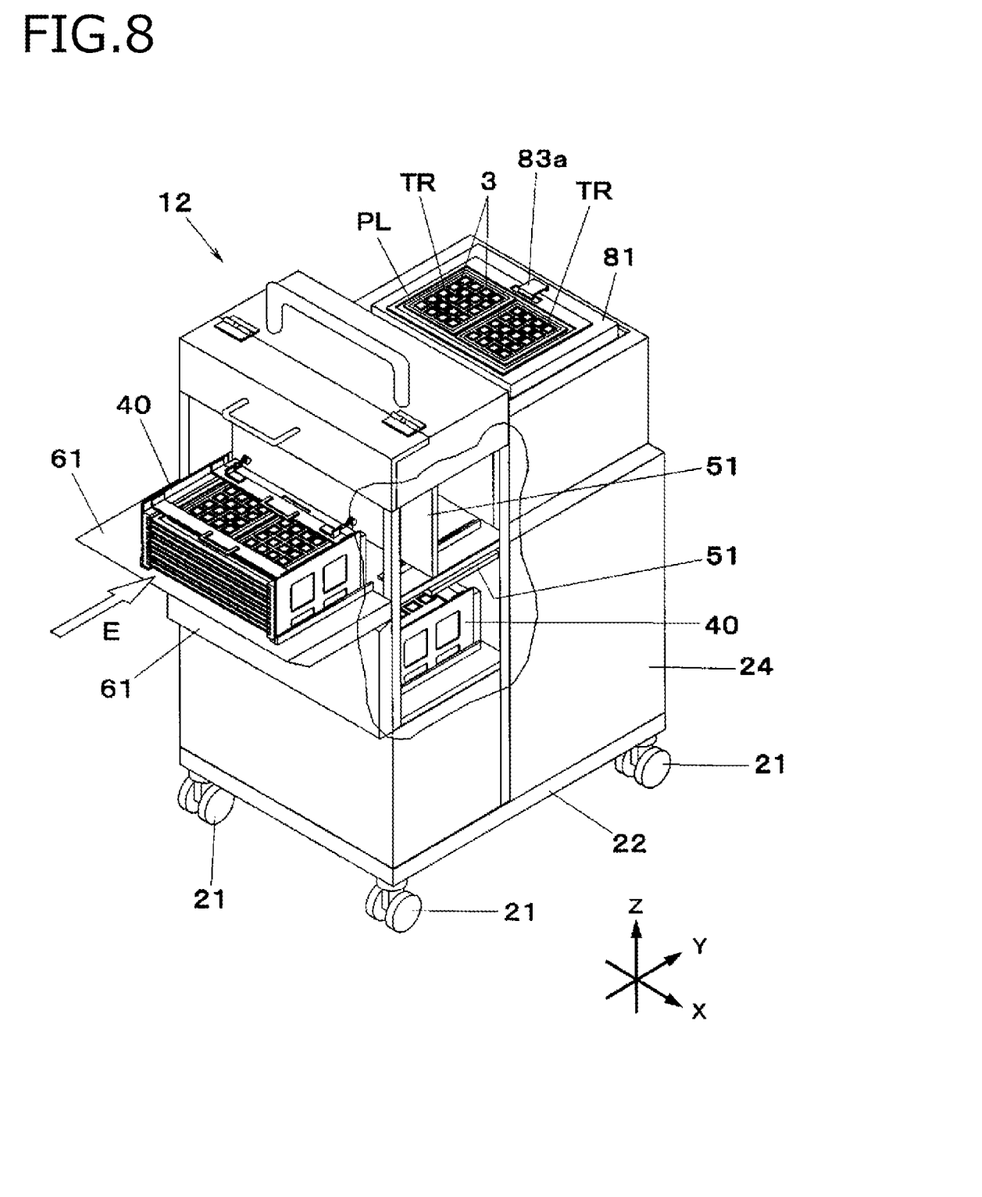
FIG. 8 is a perspective view of the tray feeder in the embodiment of the invention.
Figure 9A:
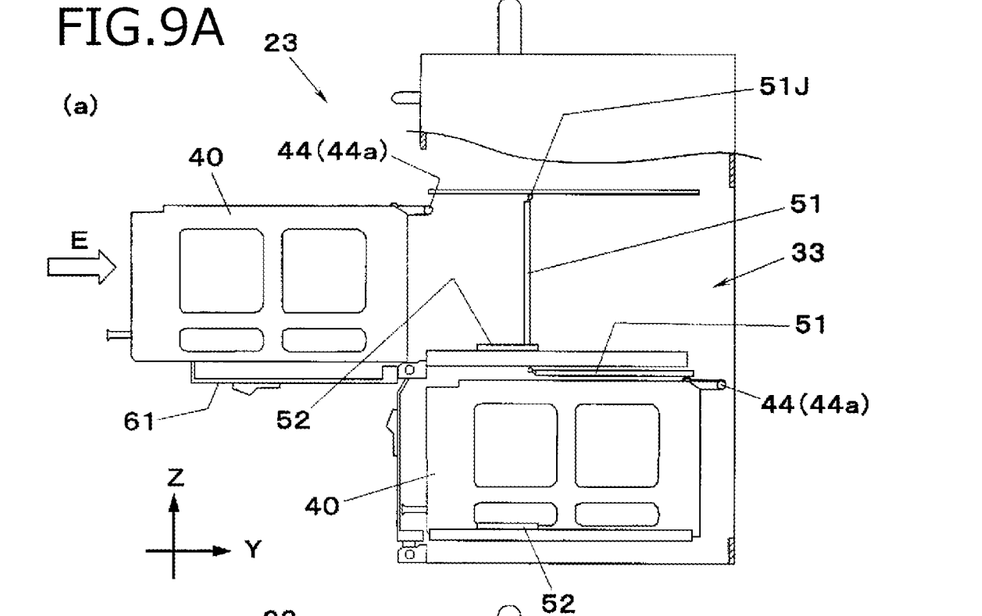
FIGS. 9A and 9B are partial side views of the tray feeder in the embodiment of the invention.
Figure 10A:
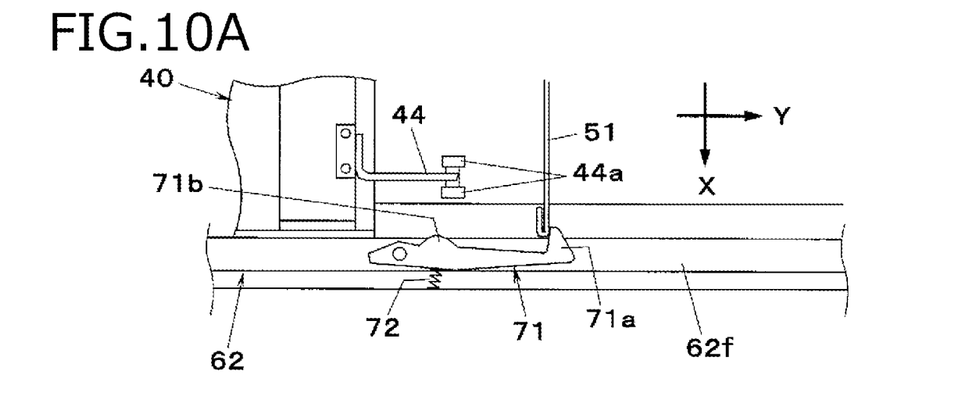
FIGS. 10A, 10B and 10C are partial plan views of the tray feeder in the embodiment of the invention.
Figure 10B:
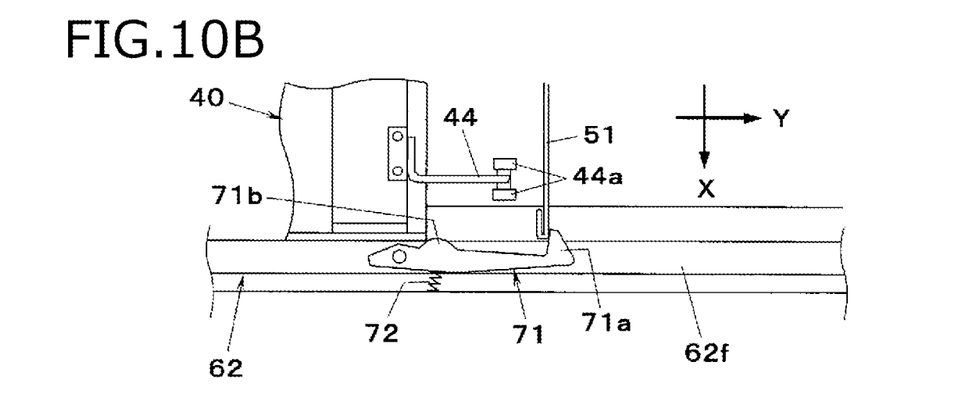
Figure 10C:
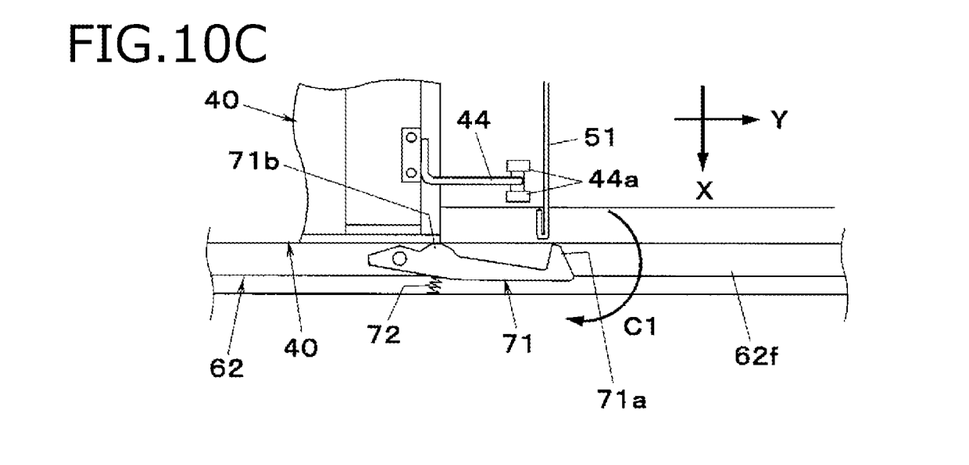

Assume that the shutter member 51 is locked in the block position by the lock mechanism 52 (the pair of lock members 71). In this state, the magazine 40 is inserted into the magazine holding portion 33 along the guides 62 (arrow E indicated in FIG. 8 and FIG. 9A). Then, after parts of the magazine 40 (lower end parts of the pair of wall portions 41) have abutted, from the front, against the protruding portions 71b of the pair of lock members 71 positioned in the lock position (FIG. 10A→FIG. 10B), the parts of the magazine 40 (the lower end parts of the pair of wall portions 41) press the protruding portions 71b of the pair of lock members 71 outwards respectively. Accordingly, the lock members 71 rotate around the pin members 73 (arrow C1 indicated in FIG. 10C). When the protruding portions 71b are pushed to reach places where the protruding portions 71b fall within the upper surface regions of the flange portions 62f, the lock members 71 are positioned in the non-lock position to thereby unlock the shutter member 51 (FIG. 10C).

Figure 9B:
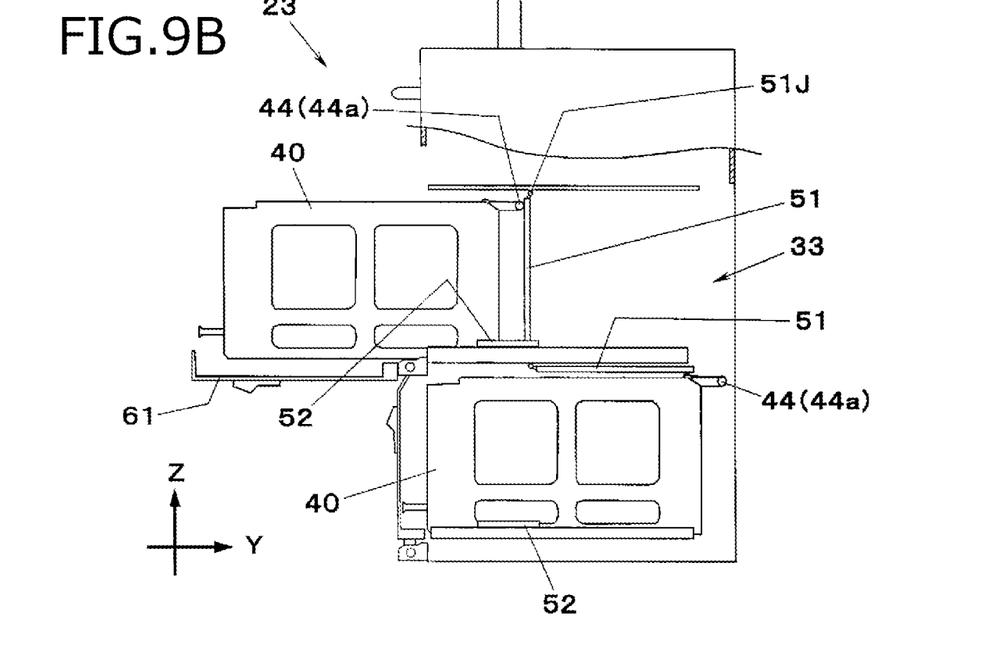
Figure 11A:
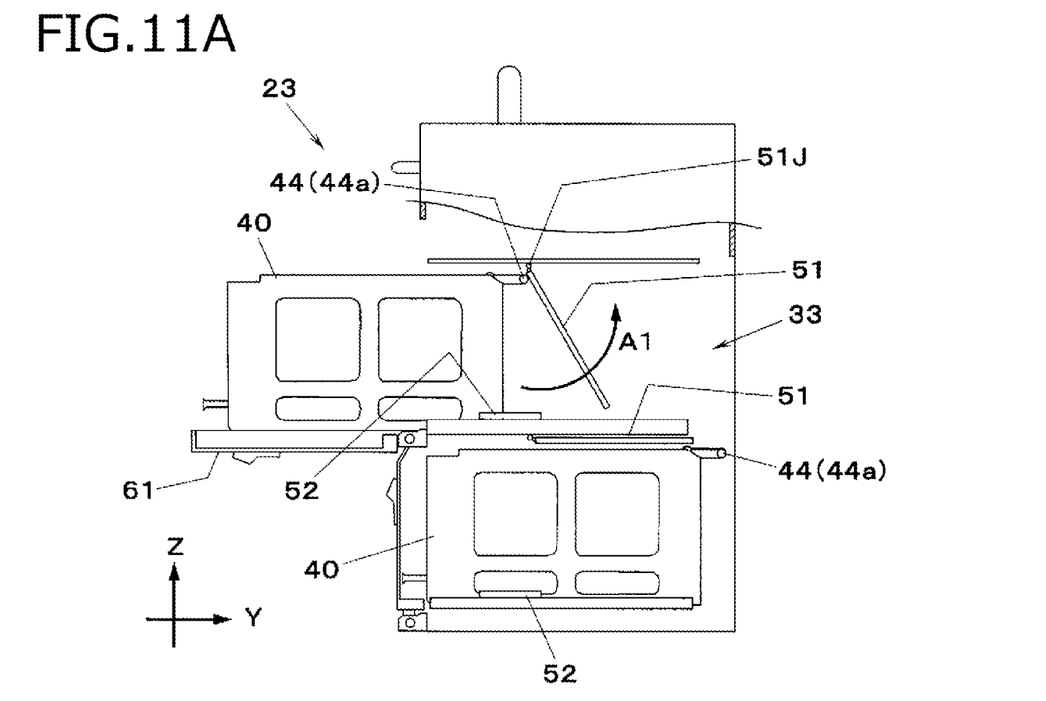
FIGS. 11A and 11B are partial side views of the tray feeder in the embodiment of the invention.
Figure 11B:
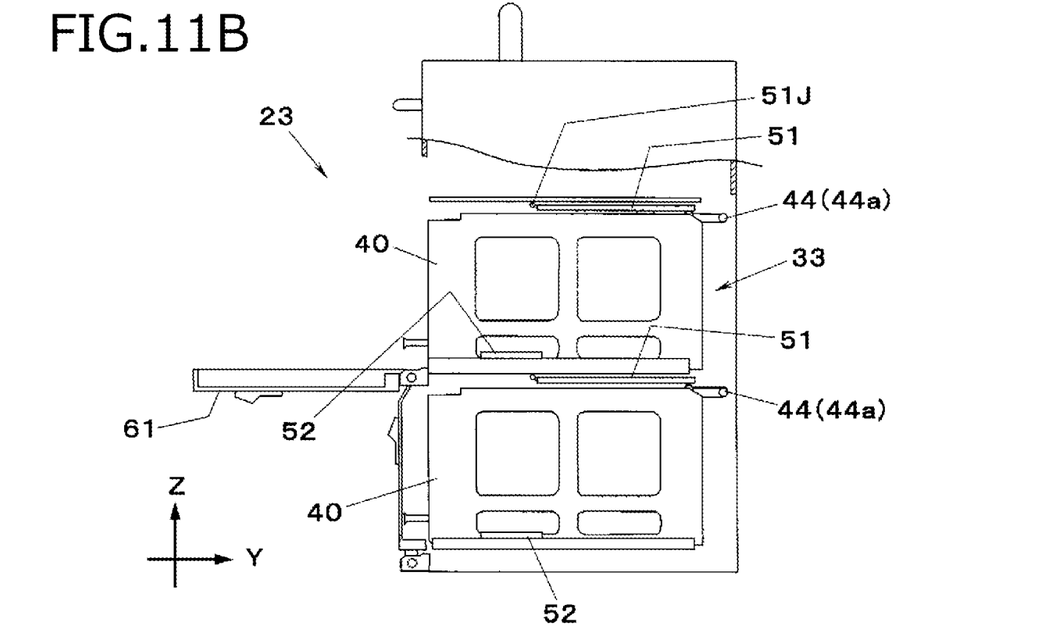

When the magazine 40 is further inserted, the rear ends (rollers 44a) of the pressing parts 44 abut against front upper portions of the shutter member 51 (FIG. 9B) to press the shutter member 51 rearwards. Accordingly, the shutter member 51 swings around the swing shafts 51J of the hinge members 51H (arrow A1 indicated in FIG. 11A). In the state in which the magazine 40 is completely received in the magazine holding portion 33, the shutter member 51 takes a substantially horizontal posture along the upper surface of the magazine 40 to be positioned in the non-block position (FIG. 11B).

Figure 12A:
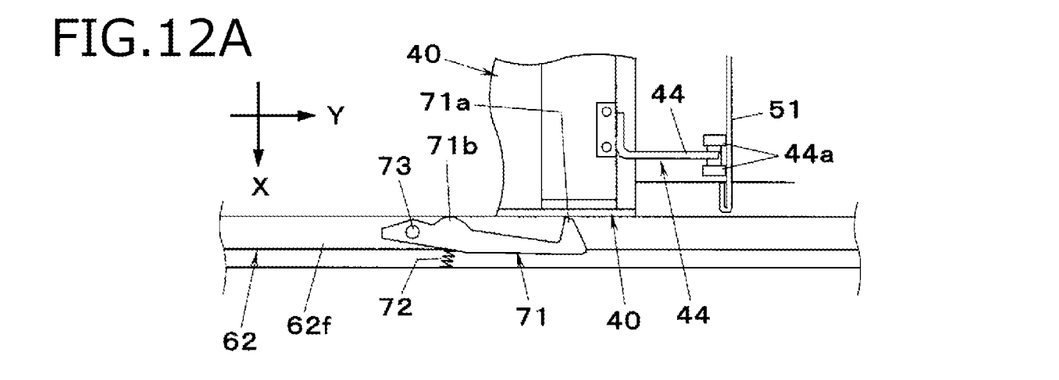
FIGS. 12A, 12B and 12C are partial plan views of the tray feeder in the embodiment of the invention.
Figure 12B:
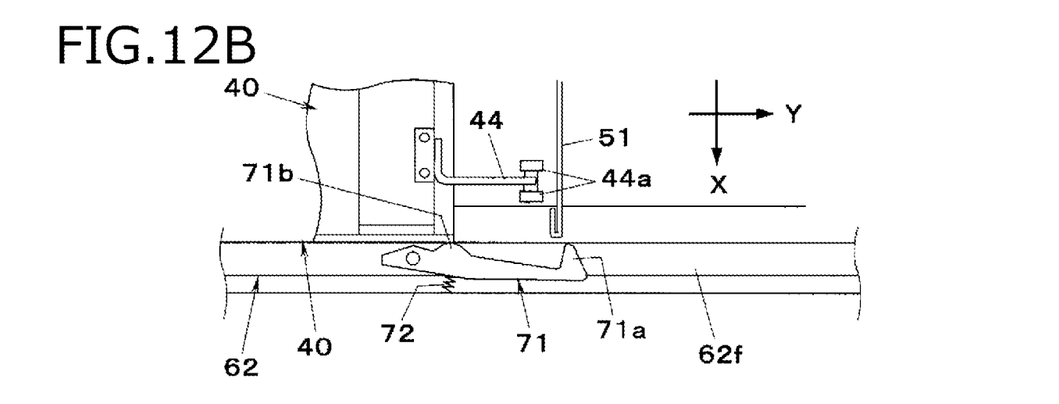
Figure 12C:
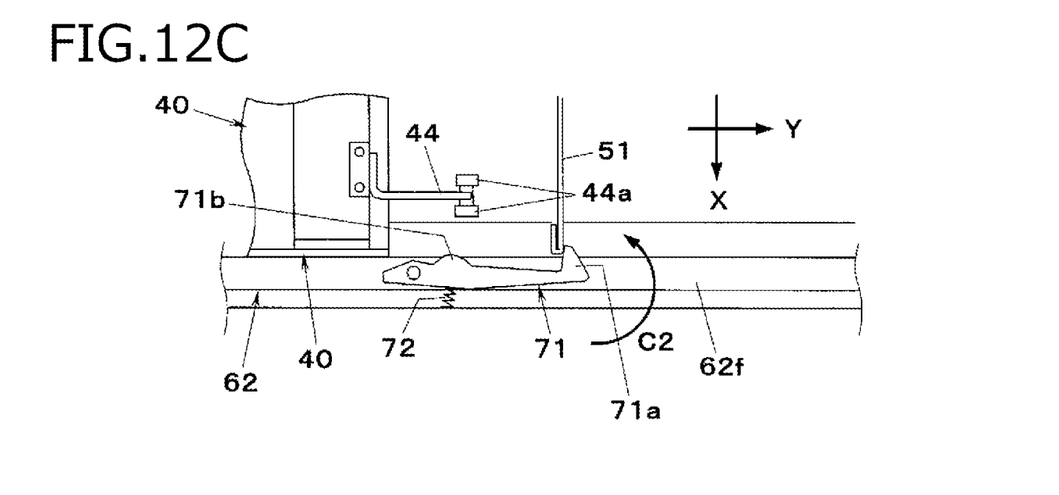

On the other hand, when the magazine 40 which is held in the magazine holding portion 33 is removed from the magazine exit/entrance 33a for batch replacement of the trays TR etc., the shutter member 51 swings from the non-block position toward the block position due to its own weight while being supported by the pressing parts 44 (FIG. 12A→FIG. 12B). The shutter member 51 is positioned in the block position immediately before the protruding portions 71b of the pair of lock members 71 is released from the pressure of the magazine 40 (FIG. 12B). Further, when the magazine 40 is removed so that the protruding portions 71b can be released from the pressure, the lock members 71 rotate around the pin members 73 by the urging forces of the urging springs 72 (arrow C2 indicated in FIG. 12C). When the pair of lock members 71 are positioned in the lock position, the shutter member 51 is locked (FIG. 12C).

As described above, when the magazine 40 is inserted into the magazine holding portion 33, the shutter member 51 is pressed by the inserted magazine 40 (that is, interlocks with the operation of insertion of the magazine 40) to swing and move from the block position to the non-block position. In addition, when the magazine 40 is removed from the magazine holding portion 33, the shutter member 51 swings due to its own weight (i.e. interlocks with the operation of removal of the magazine 40 from the magazine exit/entrance) and moves from the non-block position to the block position. Thus, the shutter member 51 is a constituent of a block unit which blocks communication between the magazine exit/entrance 33a and the tray extraction port 33b when the magazine 40 has been removed from the magazine exit/entrance 33a. In addition, the lock mechanism 52 can lock the shutter member 51 which has been positioned in the block position, in the block position, and can interlock with the operation of insertion of the magazine 40 into the magazine holding portion 33 to thereby unlock the shutter member 51. The lock mechanism 52 is also a constituent of the block unit.

In FIG. 2, the tray movement portion 24 includes a tray placement table 81, a lift mechanism 82 and an extraction mechanism 83. The tray placement table 81 is made of a flat plate-like member. In the lift mechanism 82, a ball screw 82a which extends in the up/down direction is driven to rotate by a motor 82b to thereby lift up/down the tray placement table 81 (arrow F indicated in FIG. 2). The extraction mechanism 83 includes a hook portion 83a and a hook portion movement mechanism 83b which moves the hook portion 83a in the front/rear direction on an upper surface of the tray placement table 81.

A recess TK (FIG. 5B) is provided in an upper surface of each pallet PL and in a position where the recess TK will be at the rear (on the side of the tray movement portion 24) when the magazine 40 is held in the magazine holding portion 33. In order to extract a tray TR (directly, a pallet PL) from the rack portion 23 and position the extracted tray TR (directly, the pallet PL) in the component feed position, the tray movement portion 24 drives the ball screw 82a by the motor 82b to lift up/down the tray placement table 81 to thereby position the tray placement table 81 at the rear of the magazine 40 in which the tray TR to be extracted is received (in particular, at the rear of the tray extraction port 33b of the magazine holding portion 33 in which the magazine 40 is held). After the hook portion 83a is moved forwards and hooked at the recess TK of the pallet PL, the hook portion 83a is moved rearwards so that the pallet PL (i.e. the tray TR) can be placed on the tray placement table 81. When the pallet PL is placed on the tray placement table 81, the ball screw 82a is driven by the motor 82b to lift up the tray placement table 81 to the component feed position (FIG. 1 and FIG. 2). Thus, it is possible to feed components 3 in the component feed position so that it is possible to use the mounting head 13 to mount ones of the components 3 on the substrate 2.

As described above, in the tray feeder 12 in the embodiment, communication between the magazine exit/entrance 33a and the tray extraction port 33b is blocked by the block unit when one of the magazines 40 is removed from the magazine holding portion 33 in batch replacement work of the trays TR etc. Therefore, even if the worker puts his/her hand into the cavity which is formed after the magazine 40 has been removed from the magazine holding portion 33, the worker can be prevented from touching the tray movement portion 24 which is in operation. In addition, it is not necessary to move the magazine 40 between the magazine holding portions 33. Accordingly, a movement mechanism for the magazine 40 is not required so that it is possible to dispose the magazine holding portions 33 not in the lateral direction but in the up/down direction. Therefore, according to the tray feeder 12 in the embodiment, it is possible to secure working safety without increasing the size.

Although the shutter members 51 are attached to the ceiling surfaces of the magazine holding portions 33 in the aforementioned embodiment, configuration may be made such that the shutter members 51 are attached to the floors of the magazine holding portions 33 (to the first partition wall 32a in the magazine holding portion 33 on the lower stage side and the second partition wall 32b in the magazine holding portion 33 on the upper stage side) and the shutter members 51 are urged in a vertical erection direction by urging springs etc. When any of the magazines 40 is inserted into the magazine holding portion 33 in this case, the shutter member 51 moves while being made to fall down against urging forces of the urging springs. Even with such a configuration, the shutter member 51 swings between the block position and the non-block position. Thus, the shutter member 51 swings from the non-block position to the block position interlocking with the operation of removal of the magazine 40 from the magazine exit/entrance 33a. Incidentally, in the case of such a configuration, the shutter member 51 which has been positioned in the non-block position takes a substantially horizontal posture along a lower surface of the magazine 40 held in the magazine holding portion 33.

It is possible to provide a tray feeder and a component mounting apparatus which can secure working safety without increasing the size.

What is claimed is:

1. A tray feeder which extracts one of trays where components are stored from corresponding one of magazines, and moves the extracted tray to a component feed position, the tray feeder comprising:
   a rack portion that comprises a plurality of magazine holding portions disposed in a vertical direction, the magazine holding portions configured to hold the magazines respectively which are inserted horizontally through magazine exits/entrances provided correspondingly to the magazine holding portions; and
   a tray movement portion that extracts one of the trays from corresponding one of the magazines held in the magazine holding portions, through a corresponding one of tray extraction ports provided correspondingly to the magazine holding portions respectively, and moves the extracted tray to the component feed position,
   wherein each of the magazine holding portions comprises a block unit which blocks communication between the magazine exit/entrance and the tray extraction port provided correspondingly to one of the magazine holding portions when the magazine is removed from the corresponding one of the magazine holding portions through the magazine exit/entrance, and
   wherein the block unit comprises a swing shaft and a shutter member swingable around the swing shaft between a vertical posture for blocking the communication between the magazine exit/entrance and the tray extraction port and a substantially horizontal posture for allowing the communication between the magazine exit/entrance and the tray extraction port,
   wherein the shutter member is attached to a ceiling surface of the magazine holding portion thorough the swing shaft, and
   wherein the tray feeder further comprises:
   a lock member that has a lock portion and a protruding portion,
   wherein the lock member moves between "lock position" and "non-lock position" depending on a state that the protruding portion is pushed or not, and
   wherein in the state of the "lock position", the lock portion is protruded in the magazine holding portion and locked to the shutter member.

2. The tray feeder according to claim 1, wherein the shutter member is supported to be able to swing around a swing shaft which extends a horizontal direction perpendicular to an insertion direction of the magazine into the corresponding one of the magazine holding portions; and
   wherein in the non-block position, the shutter member is positioned at a substantially horizontal posture along the magazine held in the corresponding one of the magazine holding portions.

3. The tray feeder according to claim 2, wherein when the magazine is inserted into the corresponding one of the magazine holding portion, the shutter member is pressed by the inserted magazine to swing and move from the block position to the non-block position; and wherein when the magazine is removed from the corresponding one of the magazine holding portions, the shutter member swings and moves from the non-block position to the block position due to its own weight.

4. The tray feeder according to claim 1, wherein the block unit comprises a lock mechanism which locks the shutter member positioned in the block position at the block position and unlocks the locked shutter member in accordance with an operation of insertion of the magazine into the corresponding one of the magazine holding portions.

5. A component mounting apparatus comprising:

the tray feeder according to claim 1; and a mounting head, wherein the tray feeder moves one of the trays to the component feed position to thereby feed the components to the mounting head; and wherein the mounting head picks up ones of the components and mounts the picked components on a substrate.

* * * * *